United States Patent [19]

Bayraktaroglu

[11] Patent Number: 5,213,987

[45] Date of Patent: May 25, 1993

[54] METHOD OF INTEGRATING HETEROJUNCTION BIPOLAR TRANSISTORS WITH PIN DIODES

[75] Inventor: Burhan Bayraktaroglu, Plano, Tex.

[73] Assignee: Texas Instruments Incorporated, Dallas, Tex.

[21] Appl. No.: 676,419

[22] Filed: Mar. 28, 1991

[51] Int. Cl.⁵ ............... H01L 21/265; H01L 21/70
[52] U.S. Cl. ............................. 437/24; 437/31; 437/51; 437/709
[58] Field of Search .............. 437/57, 50, 24, 31, 437/128, 59, 126, 51; 357/43, 30, 58

[56] References Cited

U.S. PATENT DOCUMENTS

| | | | |
|---|---|---|---|
| 4,710,787 | 12/1987 | Usagawa et al. | 357/58 |
| 4,716,445 | 12/1987 | Sone | 357/16 |
| 4,716,449 | 12/1987 | Miller | 357/4 |
| 4,981,807 | 1/1991 | Jambotkar | 437/31 |
| 4,983,532 | 1/1991 | Mitani et al. | 437/31 |
| 5,068,756 | 11/1991 | Morris et al. | 357/34 |
| 5,097,312 | 3/1992 | Bayraktaroglu | 357/43 |

FOREIGN PATENT DOCUMENTS

| | | | |
|---|---|---|---|
| 0240567 | 10/1987 | European Pat. Off. | |
| 0390061 | 10/1990 | European Pat. Off. | 437/59 |
| 0392480 | 10/1990 | European Pat. Off. | |
| 3629684 | 3/1988 | Fed. Rep. of Germany | 357/30 |
| 0181055 | 10/1984 | Japan | 437/59 |

OTHER PUBLICATIONS

Patent Abstracts of Japan, vol. 11, No. 224 (E-525) (2671); Jul. 21, 1987 and JP-A-62 040 778 (Fujitsu Ltd.) Feb. 21, 1987.
G. Sasaki, et al., "Monolithic Integration of HEMTs and HBTs on an InP Substrate and Its Application to OEICs", *Int. Electron Dev. Meeting Technical Digest*, p. 896, 1989.

*Primary Examiner*—Olik Chaudhuri
*Assistant Examiner*—Loc Q. Trinh
*Attorney, Agent, or Firm*—Michael K. Skrehot; James C. Kesterson; Richard L. Donaldson

[57] ABSTRACT

Generally, and in one form of the invention, a semi-insulating semiconductor substrate 10 is provided having a first surface. An HBT subcollector region 12 of a first conductivity type is implanted in the substrate 10 at the first surface. A PIN diode region 14 of the first conductivity type is then implanted in the substrate 10 at the first surface and spaced from the HBT subcollector region 12. Next, an i-layer 16 is grown over the first surface. Next, an HBT base/PIN diode layer 22 of a second conductivity type is selectively grown on the i-layer 16 over the HBT subcollector region 12 and the PIN diode region 14. Then, an HBT emitter layer 24/26/28 of the first conductivity type is selectively grown over the HBT base/PIN diode layer 22, the HBT emitter layer 24/26/28 having a wider energy bandgap than the HBT base/PIN diode layer 22. Afterwards, an isolation region 30 is implanted at the boundary between the HBT subcollector region 12 and the PIN diode region 14, the isolation region 30 extending down into the substrate 10. Next, the HBT emitter layer 24/26/28 is etched away over the PIN diode region 14. Lastly, conductive contacts 32, 36, 40, 38 and 42 are formed to the HBT emitter layer 24/26/28, the HBT base layer 22, the HBT subcollector region 12, the PIN diode layer 22 and the PIN diode region 14.

4 Claims, 3 Drawing Sheets

METHOD OF INTEGRATING HETEROJUNCTION BIPOLAR TRANSISTORS WITH PIN DIODES

CROSS-REFERENCE TO RELATED APPLICATIONS

The following coassigned patent applications are hereby incorporated herein by reference: Ser. No. 07/677,019, filing date Mar. 28, 1991, now U.S. Pat. No. 5,166,083.

FIELD OF THE INVENTION

This invention generally relates to a method of integrating heterojunction bipolar transistors with PIN diodes.

BACKGROUND OF THE INVENTION

Without limiting the scope of the invention, its background is described in connection with an integrated transmitter circuit, as an example.

Heretofore, in this field, advanced microwave systems have required different types of devices for the optimum operation of multifunction circuits. For example, the transmitter circuits of communication and radar systems are better addressed with the use of heterojunction bipolar transistors (HBTs) because of their higher efficiency and higher power density. On the other hand, receiver circuits of these same systems prefer the use of field effect transistors (FETs), such as high electron mobility transistors (HEMTs), to minimize the noise figure and therefore improve the receiver sensitivity. Other circuit functions in these systems, such as transmit/receive (T/R) switches and phase shifting functions may best be accomplished with PIN diodes.

High-speed three terminal devices such as HBTs and heterojunction FETs (HFETs) and microwave diodes such as PIN, IMPATT, mixer, etc. are normally fabricated by epitaxial growth techniques on insulating substrates. Because of vastly differing exitaxial layer properties for each of these devices, each device structure is grown by an epitaxial growth technique that is best suited to the desired properties of that layer. Furthermore, the high-speed (or microwave) requirements placed on the device forces the growth of each device structure alone on the substrate to maximize performance. Integration of different types of microwave devices on the same substrate has been attempted in the past by epitaxial re-growth or ion implantation techniques (see, for example, U.S. patent application Ser. No. 07/560,501, assigned to the same assignee as the present case).

The integration of two or more heterojunction devices on the same substrate cannot be implemented by the method described above. Each heterojunction growth requires a separate epitaxial growth specifically designed to optimize the performance of each heterojunction type. The integration of an HBT and HEMT has been attempted in the past (see, for example, G. Sasaki et al., "Monolithic Integration of HEMTs and HBTs on an InP Substrate and Its Application to OE-ICs", *Int. Electron Dev. Meeting Technical Digest*, 1989, p. 896) by sequentially growing all of the epitaxial layers required for each device at one time, and subsequently removing any unwanted layers in the area of each device during fabrication. This method is called "stacked-layer method".

Some of the problems posed by the stacked-layer method have been a large number of layers required, the need to remove portions of several layers during processing and a resultant non-planar device. Accordingly, improvements which overcome any or all of the problems are presently desirable.

SUMMARY OF THE INVENTION

It is herein recognized that a need exists for a method of integrating heterojunction bipolar transistors with PIN diodes. The present invention is directed towards meeting those needs.

The performance, size, volume and cost of such microwave systems can be reduced if all of the subsystem functions can be accomplished with the use of a common device process technique to integrate all of the relevant advanced devices onto the same substrate. The T/R module of a phased-array radar or a communication system (such as a cellular telephone), for example, may be fabricated in the form of a single monolithic integrated circuit (MMIC) if a process were developed that would allow the formation of all of the relevant advanced devices on the same substrate. At present, this is accomplished by fabricating each circuit on separate substrates and then connecting the substrates in a module.

Generally, and in one form of the invention, a semi-insulating semiconductor substrate is provided having a first surface. An HBT subcollector region of a first conductivity type is implanted in the substrate at the first surface. A PIN diode region of a first conductivity type is then implanted in the substrate at the first surface and spaced from the HBT subcollector region. Next, an HBT base/PIN diode layer of a second conductivity type is selectively grown on the i-layer over the HBT subcollector region and the PIN diode region. Then, an HBT emitter layer on the first conductivity type is selectively grown over the HBT base/PIN diode layer, the HBT emitter layer having a wider energy bandgap than the HBT base/PIN diode layer. Afterwards, an isolation region is implanted at the boundary between the HBT subcollector region and the PIN diode region, the isolation region extending down into the substrate. Next, the HBT emitter layer is etched away over the PIN diode region. Lastly, conductive contacts are formed to the HBT emitter layer, the HBT base layer, the HBT subcollector region, the PIN diode layer and the PIN diode region.

An advantage of the invention is that it provides a single process in which HBTs and PIN diodes can be fabricated on the same substrate.

BRIEF DESCRIPTION OF THE DRAWINGS

The foregoing and further aspects of the invention are illustrated in the accompanying drawings wherein like elements are denoted by like reference designators and in which.

DETAILED DESCRIPTION OF PREFERRED EMBODIMENTS

One example of the epitaxial layer requirements of HBTs, HEMTs, and PIN diodes are shown in Tables 1–3, respectively.

TABLE 1

HBT Structure

| No. | Layer | Thickness (μm) | Doping (cm$^{-3}$) |
|---|---|---|---|
| 1 | Emitter Contact | 0.15 | $2-3 \times 10^{18}$ |
| 2 | Grading | 0.05 | $1 \times 10^{18}$ |
| 3 | AlGaAs Emitter | 0.10 | $2 \times 10^{17}$ |
| 4 | Base | 0.10 | $1-5 \times 10^{19}$ |
| 5 | Collector | 1.00 | $1 \times 10^{14} - 5 \times 10^{16}$ |
| 6 | Subcollector | 1.00 | $2 \times 10^{18}$ |

TABLE 2

HEMT Structure

| No. | Layer | Thickness (μm) | Doping (cm$^{-3}$) |
|---|---|---|---|
| 1 | Contact Layer | 0.20 | $3 \times 10^{18}$ |
| 2 | AlGaAs Donor Layer | 0.05 | $1 \times 10^{18}$ |
| 3 | i-Layer (Buffer) | 1.00 | $1-5 \times 10^{14}$ |

TABLE 3

PIN Diode Structure

| No. | Layer | Thickness (μm) | Doping (cm$^{-3}$) |
|---|---|---|---|
| 1 | p-Layer | 0.10 | $1-5 \times 10^{19}$ |
| 2 | i-Layer | 1.00 | $1-5 \times 10^{14}$ |
| 3 | n-Layer | 1.00 | $2-3 \times 10^{18}$ |

It can be seen from Tables 1-3 that the epitaxial layer thicknesses and doping concentrations of the three types of devices are not directly compatible with each other. Depending on the frequency of operation, the thicknesses (and possibly the doping concentrations) can change further. The values shown above are for a typical X-band (8 GHz-12 GHz) application.

It is important to note that both the HEMT transistor and the PIN diode require a thick (nominally 1.0 μm) i-layer. This layer is essential to the operation of these two devices, and it must be highly resistive and pure (i.e. low defect density). The HBT structure, although not directly requiring the use of such a layer, can accept a layer of similar thickness in its collector. It is the aim of the present invention to use a common i-layer between the three devices and to use modified processing techniques to enable the growth of all structures on the same wafer without compromising the performance of any of the devices.

A first preferred embodiment of the present invention is a method of fabricating HBTs, HEMTs and PIN diodes on the same semiconductor substrate. FIGS. 1A-G show the steps of the method of the first preferred embodiment in which the relative dimensions are exaggerated for clarity.

Figure 1A:
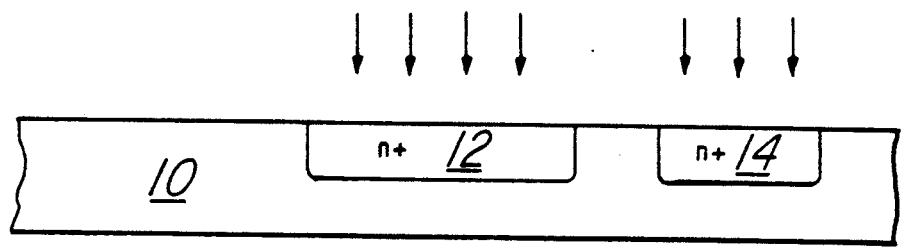
FIG. 1A–G is a cross sectional view showing the steps of constructing a device according to the method of the first preferred embodiment of the present invention.

In FIG. 1A, a semi-insulating substrate 10, such as GaAs, is provided. Using a suitable mask (not shown), the n+ subcollector layer 12 of the HBT and the n+ layer 14 of the PIN diode are selectively implanted into the substrate 10 to a concentration of $2 \times 10^{18}$ atoms/cm$^2$. Si is the preferred ion, but S, Te, Sn, Se or Ge may, for example, also be used. The implanted ions may optionally be activated at this stage or prior to the epitaxial growth, in the growth chamber (in situ), which follows.

Figure 1B:
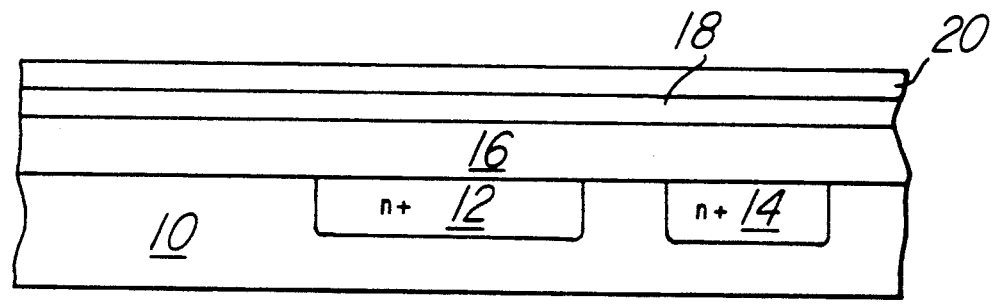

In FIG. 1B, the ion implantation mask (not shown) is removed, the surface of substrate 10 is cleaned and the layers required for the HEMT device are epitaxially deposited across the entire substrate. These layers include the i-layer buffer 16, the n-type AlGaAs electron donor layer 18 and the n+ contact layer 20. The donor layer 18 is composed of a semiconductor material having a wider energy bandgap than the buffer 16, preferably AlGaAs. The i-layer buffer 16 and contact layer 20 may be made of GaAs. Si is the preferred dopant species. Molecular beam epitaxy (MBE) is the preferred deposition method because it has the capacity to grow the HEMT structure with a sharp heterointerface between the layers 16 and 18, which is needed for two dimensional electron gas formation, but Metal Organic Chemical Vapor Deposition (MOCVD) can also be used. MBE is also most suited for the growth of the i-layer 16 required for the HEMT buffer and the PIN structure.

Figure 1C:
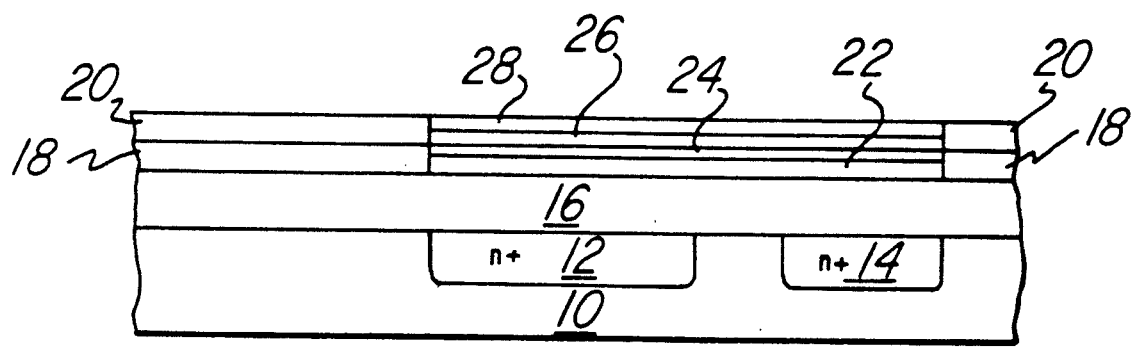

In FIG. 1C, the wafer surface is covered with silicon nitride (not shown). A layer of photoresist (not shown) is then spun on over the silicon nitride layer and patterned to exposed the regions laying over the n+ buried layers 12 and 14. This pattern is then transferred to the silicon nitride layer by plasma etching and the remainder of the photoresist is removed. The silicon nitride layer (which is now patterned) is used as an etch mask to remove the n+ contact layer 20 and the AlGaAs channel layer 18 by wet chemical (or reactive ion)etch. Selective re-growth of p-type GaAs base layer 22, n-type emitter layer 24, grading layer 26 and n+ GaAs emitter contact layer 28 is then performed through the silicon nitride mask. Emitter layer 24 is formed with a semiconductor material having a wider energy bandgap than the base layer 22, preferably AlGaAs. Grading layer 26 is formed to be a smooth transition in bandgap from the wide bandgap emitter layer 24 material (e.g. AlGaAs) at the bottom, to the narrow bandgap emitter contact layer 28 material (e.g. GaAs). Metal Organic Chemical Vapor Deposition (MOCVD) is the preferred epitaxial method for this re-growth, but MBE can also be used. Because the thickness of the removed layers is approximately the same as the re-grown layers, the wafer surface planarity is preserved. The silicon nitride layer is removed at this stage and this completes the structure growth.

Figure 1D:
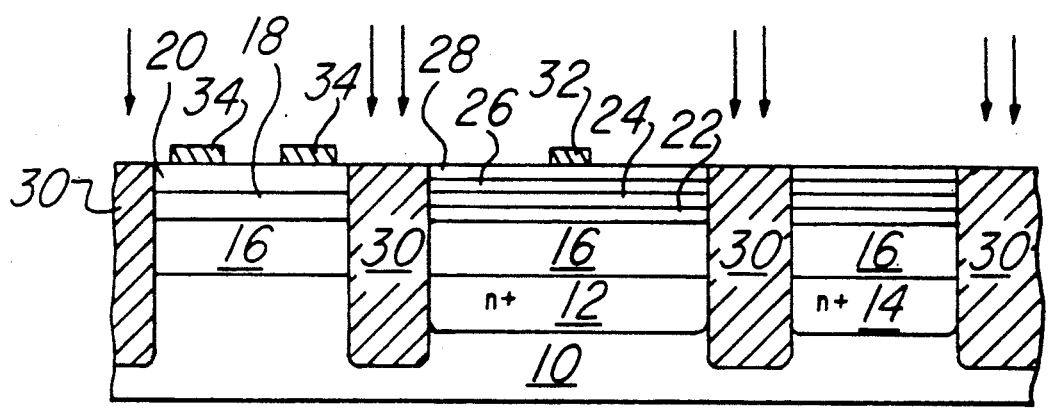

In FIG. 1D, device isolation areas 30 are formed by ion implantation, preferably using oxygen, but gallium, boron or protons can also be used. Photoresist (not shown) is spun on and patterned to define the location of HBT emitter contact 32 and HEMT source and drain contacts 34. AuGe/Ni/Au metals are evaporated in sequence at thicknesses of 500, 140 and 4000 Angstroms, respectively, onto the photoresist and exposed areas. The photoresist is then removed, which lifts off the metal except those portions 32 and 34 that define the HBT emitter and HEMT source/drain contacts. The contacts 32 and 34 are then alloyed at 430° C. for 1 minute to complete the ohmic contact formation.

Figure 1E:
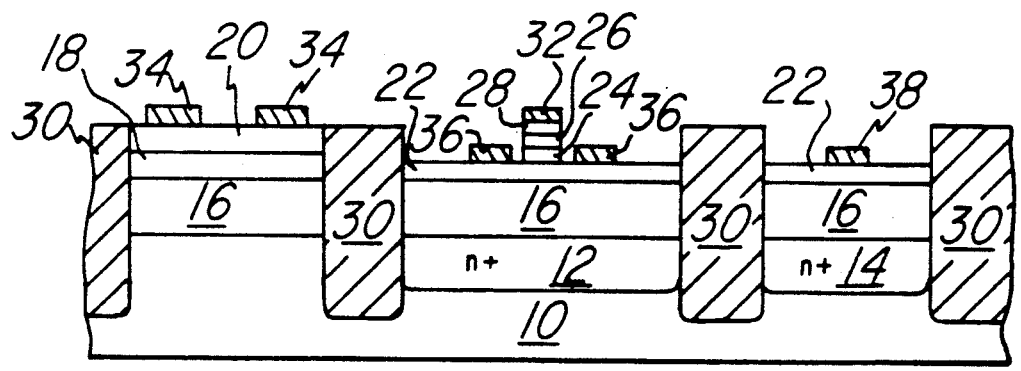

As shown in FIG. 1E, the HBT emitter is formed by etching all portions of epilayers 24, 26 and 28 not masked by emitter contact 32 down to the base epilayer 22 using a reactive ion etch (RIE in BCl$_3$, CCl$_2$F$_2$, or CCl$_4$) or similar anisotropic etch technique. This also removes epilayers 24, 26 and 28 in the PIN diode region. The HBT base contacts 36 and the PIN diode anode contact 38 are defined with photoresist and suitable base metals such as Ti/Pt/Au in thicknesses of 500, 250 and 2000 Angstroms, respectively, are sequentially evaporated onto the photoresist and exposed areas. The photoresist is then removed, which lifts off the metal except those portions 36 that define the base contacts and those portions 38 that define the anode contact.

Figure 1F:
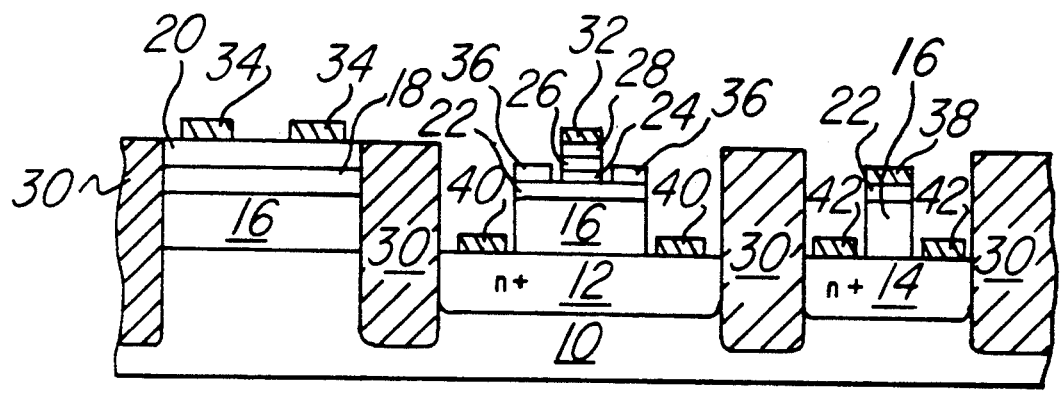

As shown in FIG. 1F, HBT collector contacts 40 and PIN diode cathode contacts 42 are established by depositing a photoresist mask to define the collector and cathode contact areas, chemically etching down to the buried layers 12 and 14 in a solution of $H_2SO_4:H_2O_2:H_2O$ (1:8:160), and then evaporating AuGe/Ni/Au in sequence at thicknesses of 500, 140 and 4000 Angstroms, respectively. RIE can also be used to expose the collector contact layer 12 at this stage. The evaporation mask is then removed which lifts off all metal except in the collector contact 40 and cathode contact 42 areas. The contacts 40 and 42 are then alloyed at 430° C. for 1 minute to complete the ohmic contact formation.

Figure 1G:
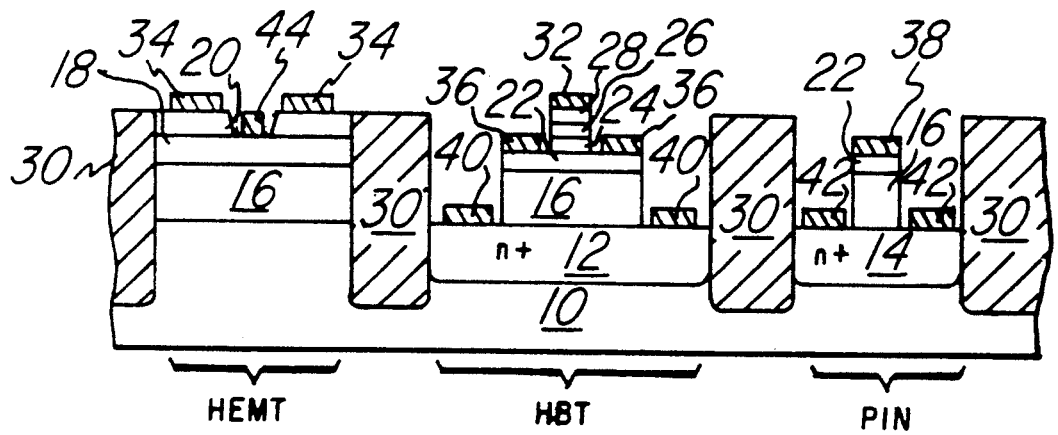

In FIG. 1G, the gate area of the HEMT is defined by a photoresist mask and etched down to AlGaAs layer 18 using $H_2SO_4:H_2O_2:2O$ (1:8:640). Suitable base metals such as Ti/Pt/Au in thicknesses of 500, 250 and 2000 Angstroms, respectively, are sequentially evaporated onto the photoresist and exposed areas. The photoresist is then removed, which lifts off the metal except that portion 44 that defines the gate contact.

The remaining process steps required to complete the integrated circuit involve such things as forming passive components, forming interconnect metallization, etc. which are performed as is well known in the art.

A preferred embodiment of the present invention has been described in detail hereinabove. It is to be understood that the scope of the invention also comprehends embodiments different from that described, yet within the scope of the claims.

For example, a HEMT is used to illustrate the first preferred embodiment method, but any type of FET device may be similarly incorporated, including pseudomorphic HEMTs requiring InGaAs layers at the heterointerface. Also, the present invention can provide for the fabrication of pnp type HBTs together with FETs and NIP diodes (a NIP diode is an upside down PIN diode, which performs the same function in a circuit).

Words of inclusion are to be interpreted as nonexhaustive in considering the scope of the invention.

Internal and external connections can be ohmic, capacitive, direct or indirect, via intervening circuits or otherwise. Implementation is contemplated in fully integrated circuits in silicon, gallium arsenide, or other electronic materials families, but GaAs is highly preferred.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of integrating a heterojunction bipolar transistor (HBT) with a PIN diode, comprising the steps of:

providing a semi-insulating semiconductor substrate having a first surface;

implanting an HBT subcollector region of a first conductivity type in said substrate at said first surface;

implanting a PIN diode region of said first conductivity type in said substrate at said first surface and spaced from said HBT subcollector region;

growing an i-layer on said first surface;

selectively growing an HBT base/PIN diode layer of a second conductivity type on said i-layer over said HBT subcollector region and said PIN diode region;

selectively growing an HBT emitter layer of said first conductivity type on said HBT base/PIN diode layer, said HBT emitter layer having a wider energy bandgap than said HBT base/PIN diode layer;

etching away said HBT emitter layer over said PIN diode region;

implanting an isolation region at the boundary between said HBT subcollector region and said PIN diode region, said isolation region extending down into said substrate; and forming conductive contacts to said HBT subcollector region, said HBT base layer, said HBT emitter layer, said PIN diode region and said PIN diode layer.

2. The method of claim 1 wherein said growing steps comprise epitaxial deposition.

3. The method of claim 1 wherein said HBT emitter layer is AlGaAs.

4. The method of claim 1 wherein said first conductivity type is n-type and said second conductivity type is p-type.

* * * * *